United States Patent
Itagaki et al.

(10) Patent No.: US 9,733,311 B2
(45) Date of Patent: Aug. 15, 2017

(54) ELECTRIC STORAGE DEVICE MANAGEMENT APPARATUS, ELECTRIC STORAGE APPARATUS, ELECTRIC STORAGE SYSTEM, AND A METHOD OF MANAGING ELECTRIC STORAGE DEVICE

(71) Applicant: GS Yuasa International Ltd., Kyoto-shi (JP)

(72) Inventors: Takeshi Itagaki, Kyoto (JP); Masashi Nakamura, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 398 days.

(21) Appl. No.: 14/456,408

(22) Filed: Aug. 11, 2014

(65) Prior Publication Data
US 2015/0044531 A1 Feb. 12, 2015

(30) Foreign Application Priority Data
Aug. 12, 2013 (JP) .................................. 2013-167465
Jul. 29, 2014 (JP) .................................. 2014-153598

(51) Int. Cl.
*G01N 27/416* (2006.01)
*G01R 31/36* (2006.01)
(Continued)

(52) U.S. Cl.
CPC ........ *G01R 31/362* (2013.01); *G01R 19/0084* (2013.01); *G01R 31/3675* (2013.01);
(Continued)

(58) Field of Classification Search
CPC .............. G01R 31/362; G01R 19/0084; G01R 31/3675; G01R 1/203; G01R 19/32;
(Continued)

(56) References Cited

U.S. PATENT DOCUMENTS 5,744,962 A   4/1998  Alber et al.
6,020,717 A * 2/2000  Kadouchi ........... B60L 11/1851
                                              320/116
(Continued)

FOREIGN PATENT DOCUMENTS

JP    S59-18544 U   2/1984
JP    S60-141575 U  9/1985
(Continued)

OTHER PUBLICATIONS

Extended European Search Report dated Jan. 27, 2015 (English Version).
(Continued)

*Primary Examiner* — Richard Isla Rodas
*Assistant Examiner* — Mohammed J Sharief
(74) *Attorney, Agent, or Firm* — McGinn IP Law Group, PLLC.

(57) ABSTRACT

An electric storage device management apparatus includes a controller that is configured to perform a voltage drop determination process to determine a voltage drop value of a conductive member that connects electric storage devices, and perform a voltage between terminals determination process to determine a voltage value between terminals of one of the electric storage devices after the voltage drop determination process.

19 Claims, 8 Drawing Sheets

(51) Int. Cl.
*H01M 10/48* (2006.01)
*H01M 10/42* (2006.01)
*G01R 19/00* (2006.01)
G01R 1/20 (2006.01)
G01R 19/32 (2006.01)

(52) U.S. Cl.
CPC ..... *H01M 10/4257* (2013.01); *H01M 10/482* (2013.01); *G01R 1/203* (2013.01); *G01R 19/32* (2013.01); *G01R 31/3606* (2013.01); *H01M 2010/4271* (2013.01)

(58) Field of Classification Search
CPC ............ G01R 31/3606; G01R 31/3648; G01R 31/3627; G01R 31/3662; G01R 31/3631; G01R 31/3668; G01R 31/006; H01M 10/4257; H01M 10/482; H01M 2010/4271; Y02E 60/12
USPC .......................................... 324/433, 426, 431
See application file for complete search history.

(56) References Cited

U.S. PATENT DOCUMENTS

| 6,448,743 | B2* | 9/2002 | Sano | G01R 31/362 320/162 |
| 7,589,534 | B2 | 9/2009 | Lee | |
| 2002/0078914 | A1* | 6/2002 | Manabe | F02N 11/0862 123/179.3 |
| 2006/0290355 | A1 | 12/2006 | Lee | |
| 2008/0071483 | A1* | 3/2008 | Eaves | G01R 31/3624 702/63 |
| 2010/0271036 | A1 | 10/2010 | Kishimoto et al. | |
| 2012/0119745 | A1* | 5/2012 | Deveau | G01R 31/3631 324/429 |
| 2013/0143086 | A1* | 6/2013 | Lee | H01M 2/1077 429/91 |
| 2013/0171480 | A1* | 7/2013 | Englert | B60L 3/0046 429/50 |
| 2013/0200700 | A1 | 8/2013 | Ohkura et al. | |
| 2014/0300347 | A1 | 10/2014 | Schramme et al. | |

FOREIGN PATENT DOCUMENTS

| JP | H11-041711 A | 2/1999 |
| JP | 2000-298160 A | 10/2000 |
| JP | 2006-032184 A | 2/2006 |
| JP | 2008-542995 A | 11/2008 |
| JP | 2010-188851 A | 9/2010 |
| JP | 2010-257750 A | 11/2010 |
| JP | 2012-078327 A | 4/2012 |
| JP | 2013-101058 A | 5/2013 |
| JP | 2014-117068 A | 6/2014 |
| WO | WO 2013/041603 A | 3/2013 |

OTHER PUBLICATIONS

English Translation of Notification of Reasons for Refusal, dated May 25, 2017, in Japanese Application No. 2014-153598.

* cited by examiner

ELECTRIC STORAGE DEVICE MANAGEMENT APPARATUS, ELECTRIC STORAGE APPARATUS, ELECTRIC STORAGE SYSTEM, AND A METHOD OF MANAGING ELECTRIC STORAGE DEVICE

CROSS-REFERENCE TO RELATED APPLICATIONS

This application claims priority from Japanese Patent Application No. 2013-167465 filed Aug. 12, 2013 and Japanese Patent Application No. 2014-153598 filed Jul. 29, 2014. The entire contents of the priority applications are incorporated herein by reference.

FIELD

Technologies described herein relates to a technology for determining a voltage between terminals of an electric storage device.

BACKGROUND

Conventionally, there has been a battery state detection unit that is connected to a battery via a bus bar and detects a voltage between terminals of the battery (JP-A-2006-032184). The battery state detection unit is configured such that a length of the bus bar is effectively short. With such a configuration, the battery state detection unit is less likely to have an influence of voltage drop caused by a resistance of the bus bar, and the voltage between the terminals of the battery can be further correctly determined.

SUMMARY

According to a specification of a battery or an environment where the battery is located, the bus bar is not effectively shortened. Even if the bus bar is effectively shortened, the battery state detection unit may be still likely to have an influence of the voltage drop caused by the resistance of the bus bar according to a shape or a material of the bus bar, for example.

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

This specification describes a technology for providing less influence of voltage drop caused by a resistance of a conductive member and determining a voltage between terminals of an electric storage device such as a battery regardless of a length or a shape of a conductive member such as a bus bar.

An electric storage device management apparatus described in this specification includes a controller that is configured to perform a voltage drop determination process to determine a voltage drop value of a conductive member that connects electric storage devices, and perform a voltage between terminals determination process to determine a voltage value between terminals of one of the electric storage devices after the voltage drop determination process.

According to the invention described in this specification, a voltage between terminals of an electric storage device such as a battery is determined regardless of a length or a shape of a conductive member with having less influence of voltage drop caused by a resistance of the conductive member.

BRIEF DESCRIPTION OF DRAWINGS

The foregoing and other features of the present invention will become apparent from the following description and drawings of an illustrative embodiment of the invention in which.

DESCRIPTION OF EMBODIMENTS

An electric storage device management apparatus described in this specification includes a controller that is configured to perform a voltage drop determination process to determine a voltage drop value of a conductive member that connects electric storage devices, and perform a voltage between terminals determination process to determine a voltage value between terminals of one of the electric storage devices after the voltage drop determination process.

With this electric storage device management apparatus, the controller is configured to perform a voltage drop determination process to determine a voltage drop value of a conductive member that connects electric storage devices and perform a voltage between terminals determination process to determine a voltage value between terminals of one of the electric storage devices after the voltage drop determination process. Accordingly, regardless of a length or a shape of the conductive member, a voltage between terminals of the electric storage device such as a battery is determined with having less influence of the voltage drop due to a resistance of the conductive member.

The electric storage device management apparatus may further include a voltage detector connected to the electric storage devices via the conductive member and configured to detect a voltage value of a current path including one of the electric storage devices and the conductive member, a memory storing a resistance value of the conductive member, and a current detector configured to detect a current value of a current flowing through the conductive member. The controller may be further configured to perform the voltage drop determination process to determine the voltage drop value of the conductive member based on the resistance value of the conductive member and the current value of the current flowing though the conductive member and perform the voltage between terminals determination process to determine the voltage value between terminals of the electric storage device based on the voltage value of the current path and the voltage drop value of the conductive member.

With this electric storage device management apparatus, the voltage drop value of the conductive member based on the resistance value of the conductive member previously stored in the memory and the current value of the current flowing through the conductive member, and the voltage value between terminals of the electric storage device is determined based on the voltage value of the current path including one of the electric storage device and the conductive member and the voltage drop value. Accordingly, even if a voltage between terminals of the electric storage device cannot be directly detected, a voltage between terminals of the electric storage device such as a battery can be determined regardless of a length or a shape of the conductive member with having less influence of the voltage drop due to a resistance of the conductive member.

The electric storage device management apparatus may further include a temperature detector configured to detect temperature of the conductive member, and the controller may be further configured to perform a resistance correction process to correct the resistance value of the conductive member according to the temperature of the conductive member and determine the voltage drop value of the conductive member based on the resistance value corrected in the resistance correction process and the current value in the voltage drop determination process.

With this electric storage device management apparatus, since the resistance value of the conductive member is corrected according to a temperature, a voltage between terminals of the electric storage device can be determined with having less influence of temperature change.

In the electric storage device management apparatus, the controller may be further configured to perform a determination process to determine whether a current flows through the conductive member and perform the voltage drop determination process and the voltage between terminals determination process according to determination that the current flows through the conductive member in the determination process.

With this electric storage device management apparatus, only when a current flows through the conductive member, the voltage drop determination process and the voltage between terminals determination process are performed. Accordingly, compared to a configuration in which the voltage drop determination process and the voltage between terminals determination process are always performed when a current of any current value flows, a load on the controller is reduced.

An electric storage apparatus may include electric storage devices connected in series and the electric storage device management apparatus.

In the electric storage apparatus, a voltage detection line may be arranged between the voltage detector and a portion of the conductive member between the electric storage devices to connect the electric storage devices and the voltage detector and detect the voltage value of the current path.

With this electric storage apparatus, one voltage detection line arranged between the voltage detector and a portion between the electric storage devices is commonly used to detect the voltage value of the current path, and this reduces the number of the voltage detection line. To commonly use the voltage detection line, a voltage detection point of the current path cannot be located near the electric storage device. However, the voltage between terminals of an electric storage device such as a battery can be determined with having less influence of the location of the voltage detection point.

The electric storage apparatus may be a vehicular electric storage apparatus that is to be mounted on a vehicle, and the controller may be further configured to perform the voltage between terminals determination process in at least one of starting of an engine of the vehicle and a regenerating operation of the vehicle.

Generally, when an internal combustion engine of the vehicle starts, a great current flows from an electric storage device such as a battery to a starter motor that starts the internal combustion engine of the vehicle and this increases a voltage drop value in a conductive member. The voltage dropping may greatly influence determination of a voltage between terminals of the electric storage device. In charging the battery during the vehicle's regenerating operation such as regenerative brake, a great current flows and this increases a voltage drop value of the conductive member. However, according to this electric storage apparatus, at the starting of the vehicular engine or in the regenerating operation, a voltage between terminals of the electric storage device such as a battery is more effectively determined with having less influence of the voltage dropping in the conductive member.

The electric storage apparatus may include an electric storage device group including the electric storage devices that are connected in series, and the electric storage device may be a battery for a starter motor of a vehicle.

With this electric storage apparatus, at the starting of the vehicular engine or in the regenerating operation, a voltage between terminals of the electric storage device such as a battery is more effectively determined with having less influence of the voltage dropping in the conductive member.

An electric storage system disclosed in this specification includes the electric storage apparatus, a plurality of electric storage device groups that are connected in series and each of which including the electric storage devices that are connected in series, and a conductive member between device groups configured to connect the electric storage device groups as the conductive member. The controller may be further configured to perform the voltage drop determination process for the conductive member between electric storage device groups and perform the voltage between terminals determination process after the voltage drop determination process for the conductive member between electric storage device groups.

In the electric storage system including a plurality of electric storage device groups, a distance between the electric storage device groups is likely to be great. This increases a voltage dropping degree in the conductive member between device groups connecting the electric storage device groups. Therefore, with this electric storage system, a voltage between terminals of an electric storage device such as a battery is more effectively determined with having less influence of the voltage dropping in the conductive member between device groups.

The invention described in this specification may be achieved in various methods such as a management apparatus, a management method, a computer program achieving functions of the management apparatus or the management method, or a recording medium storing the computer program.

First Embodiment

Figure 1:
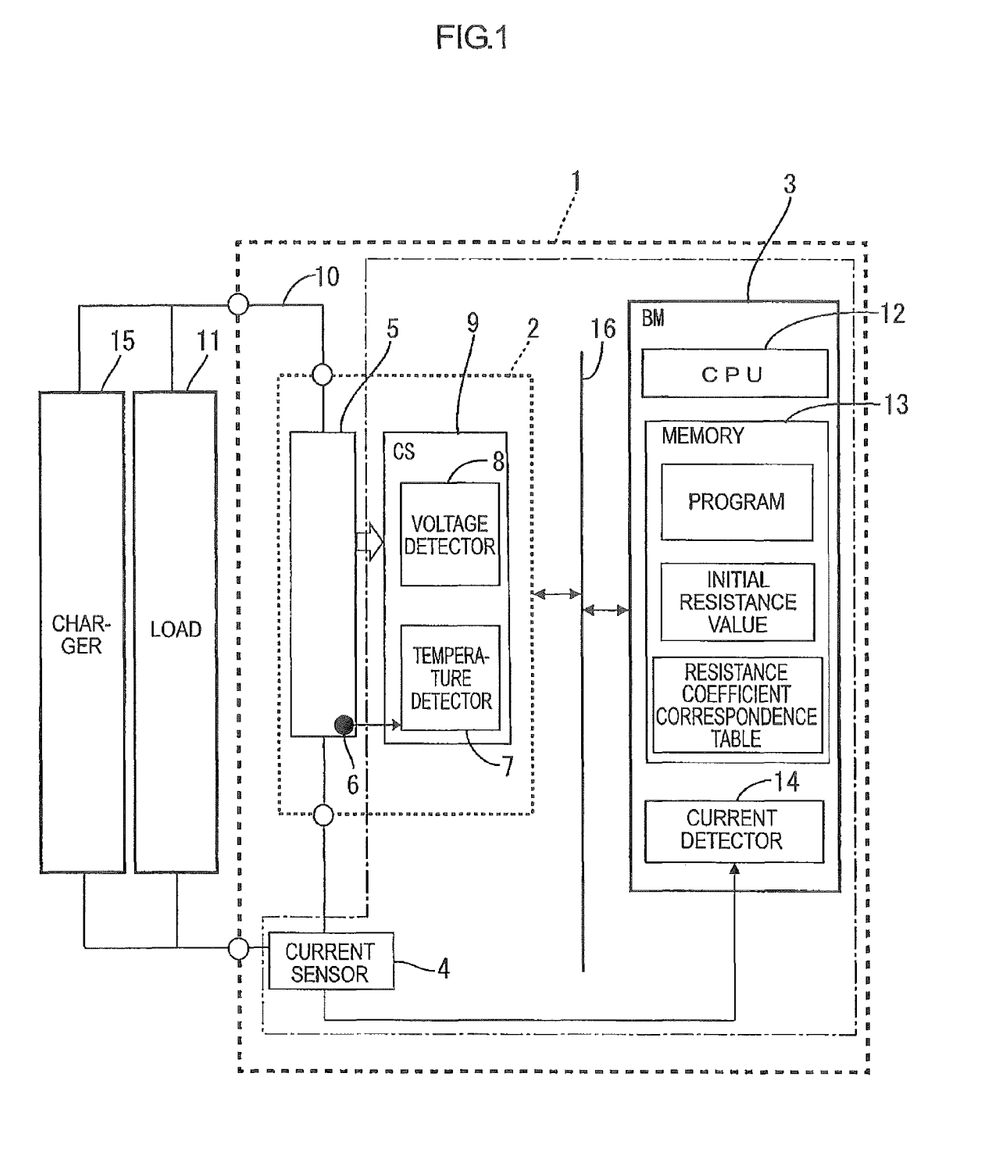
FIG. 1 is a block diagram of a battery pack according to a first embodiment.

A battery pack 1 according to a first embodiment will be described with reference to FIGS. 1 to 5. The battery pack 1 is one of examples of an electric storage apparatus. The battery pack 1 is mounted to an electric vehicle and a hybrid vehicle (hereinafter, simply referred to as a vehicle) and supplies electric power to a load 11 as illustrated in FIG. 1 according to control of an electronic control unit (not illustrated and hereinafter referred to as an ECU). Further, according to rotation of an engine (not illustrated), the battery pack 1 is charged with electric power that is generated by a charger 15.

As illustrated in FIG. 1, the battery pack 1 includes a battery module 2, a battery manager (hereinafter referred to as a BM) 3 that manages the battery module 2, and a current sensor 4. The battery module 2 includes a secondary battery 5, a temperature sensor 6, a temperature detector 7, and a voltage detector 8. The temperature detector 7 and the voltage detector 8 are arranged on a common base board, for example, to form a circuit board. Such a circuit board will be referred to as a cell sensor (CS) 9. The BM 3 and the CS 9 are examples of the electric storage device management apparatus.

The secondary battery (an example of an electric storage device group) 5 includes a plurality of cells C that are connected in series. Each of the cells C is an example of the electric storage device and is a rechargeable secondary battery or a lithium-ion battery. In FIG. 1 and in the following description, the secondary battery 5 includes four cells C. The cell is referred to as a cell C when used as a general term and the cell is referred to as a cell C1, a cell C2, a cell C3 and a cell C4 when used for designating a specific one of the four cells.

Figure 2:
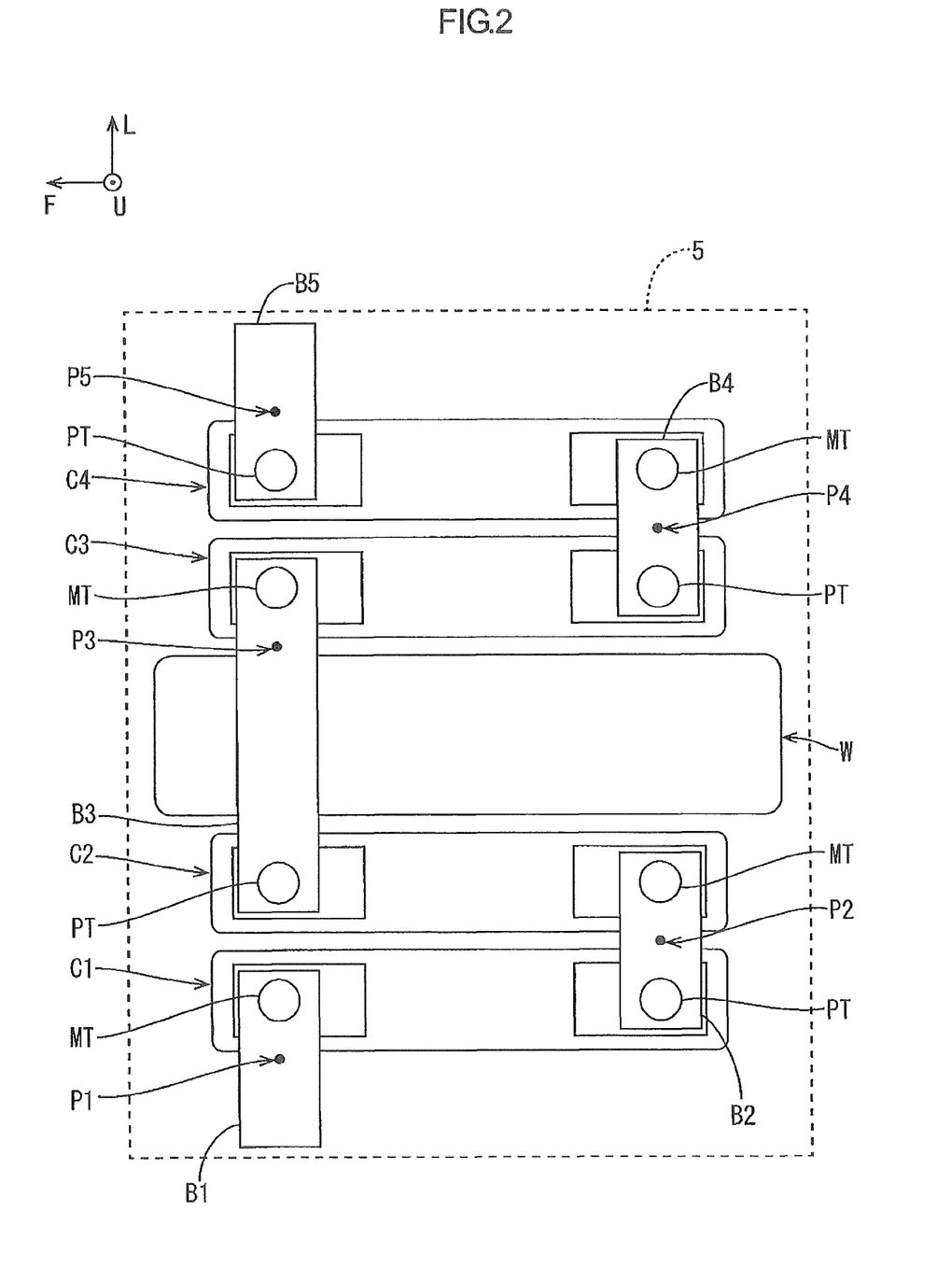
FIG. 2 is an upper view illustrating a connection configuration of cells.
Figure 3:
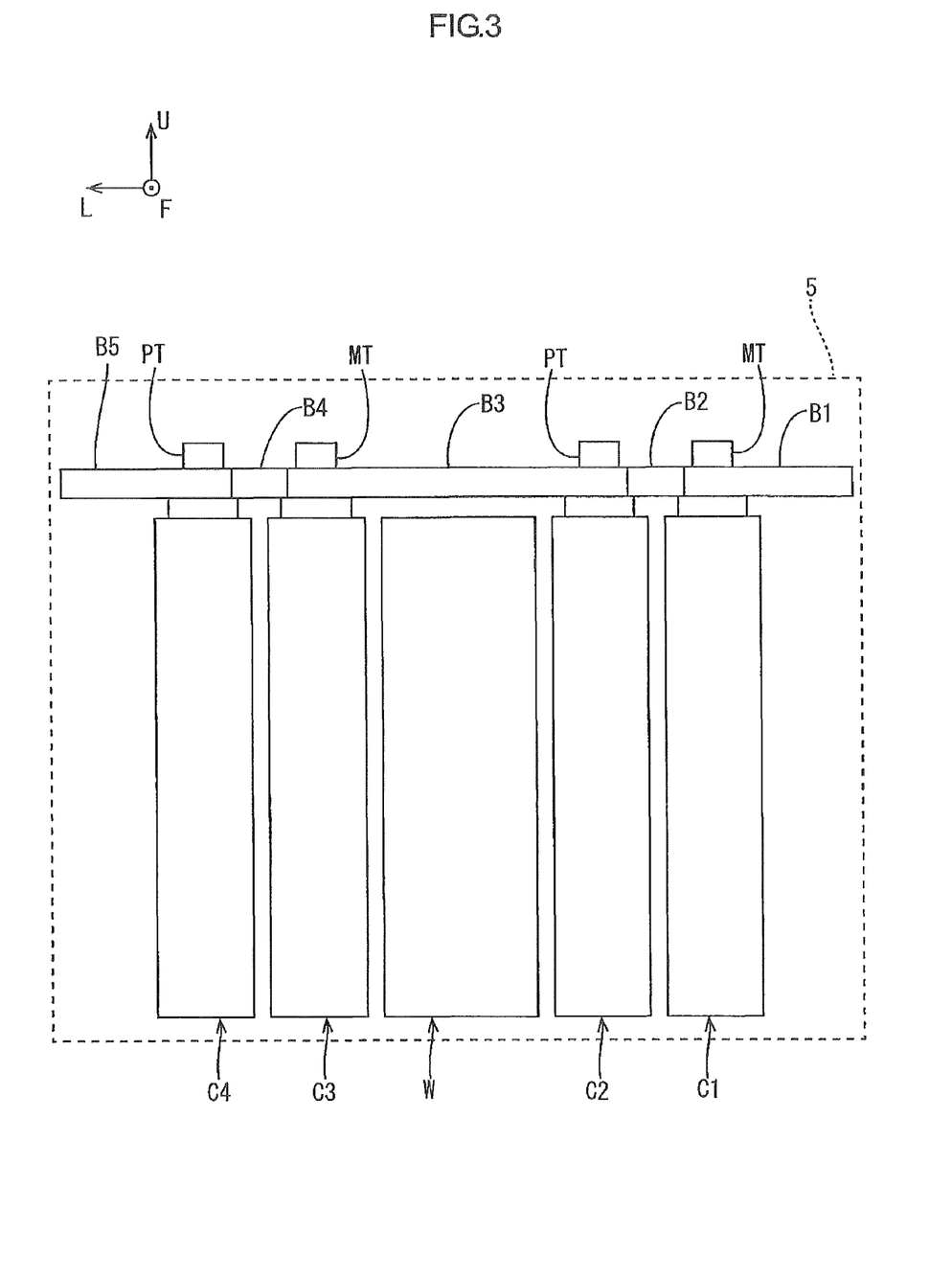
FIG. 3 is a side view illustrating a connection configuration of the cells.

As illustrated in FIGS. 2 and 3, the secondary battery 5 includes the four cells C that are arranged in a row. Each of the cells C includes a positive terminal PT and a negative terminal MT in a pair on its one end surface (an upper surface in FIG. 3). The four cells C are arranged such that the positive terminals PT and the negative terminals MT are arranged alternately on the one end surface side. The positive terminal PT of one cell C of the adjacent two cells C and the negative terminal MT of another cell C of the adjacent two cells C are connected to each other by a bus bar B so that the four cells C are electrically connected to each other in series.

The bus bar B is a conductive plate member having a constant thickness and an example of a conductive member. As illustrated in FIG. 2, the secondary battery 5 includes five bus bars B. The bus bar is referred to as a bus bar B when used as a general term and the bus bar is referred to as a bus bar B1, a bus bar B2, a bus bar B3, a bus bar B4 and a bus bar B5 when used for designating a specific one of the five bus bars.

As illustrated in FIGS. 2 and 3, the secondary battery 5 includes thermal insulation W between the cell C2 and the cell C3. With this configuration, the bus bar B3 is longer than the bus bars B1, B2, B4, B5. The thermal insulation W arranged between the cell C2 and the cell C3 increases a distance between the cells C2 and C3 and this increases a distance between the positive terminal PT of the cell C2 and the negative terminal MT of the cell C3.

As illustrated in FIG. 2, voltage detection points P1 to P5 are set on the bus bars B, respectively. In the following description, a portion of the bus bar B1 ranging from the voltage detection point P1 to the negative terminal MT of the cell C1 is referred to as a bus bar B1A, and a portion of the bus bar B2 ranging from the positive terminal PT of the cell C1 to the voltage detection point P2 is referred to as a bus bar B2B.

Similarly, a portion of the bus bar B2 ranging from the voltage detection point P2 to the negative terminal MT of the cell C2 is referred to as a bus bar B2A, and a portion of the bus bar B3 ranging from the positive terminal PT of the cell C2 to the voltage detection point P3 is referred to as a bus bar B3B.

Further, a portion of the bus bar B3 ranging from the voltage detection point P3 to the negative terminal MT of the cell C3 is referred to as a bus bar B3A, and a portion of the bus bar B4 ranging from the positive terminal PT of the cell C3 to the voltage detection point P4 is referred to as a bus bar B4B.

Further, a portion of the bus bar B4 ranging from the voltage detection point P4 to the negative terminal MT of the cell C4 is referred to as a bus bar B4A, and a portion of the bus bar B5 ranging from the positive terminal of the cell C4 to the voltage detection point P5 is referred to as a bus bar B5B.

Figure 4:
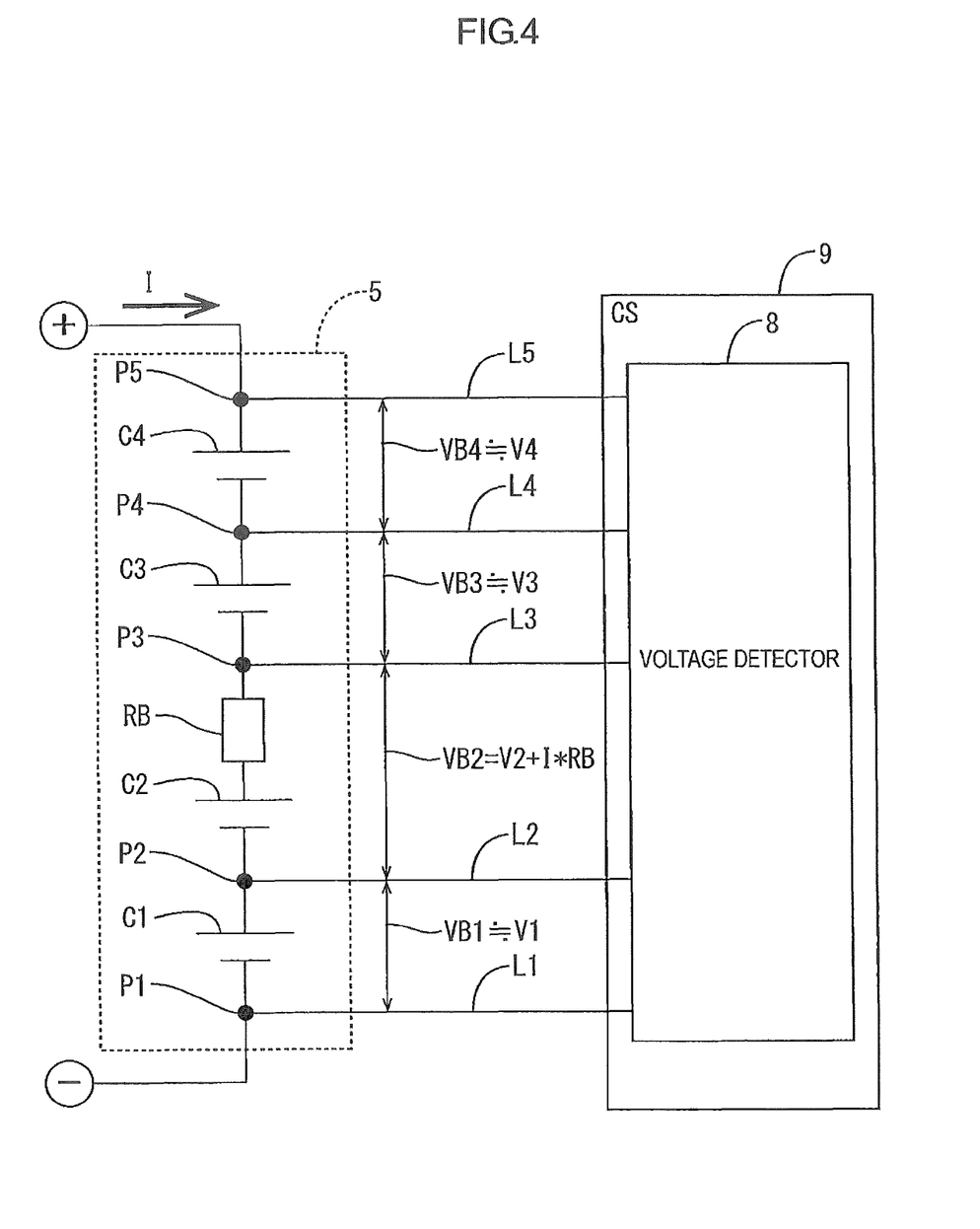
FIG. 4 is a circuit diagram illustrating an electric connection of a secondary battery.

As illustrated in FIG. 4, the voltage detection point P1 is connected to the CS 9, specifically the voltage detector 8 of the CS 9 (same in the following), via a voltage detection line L1, the voltage detection point P2 is connected to the CS 9 via a voltage detection line L2, and the voltage detection point P3 is connected to the CS 9 via a voltage detection line L3. Further, the voltage detection point P4 is connected to the CS 9 via a voltage detection line L4, and the voltage detection point P5 is connected to the CS 9 via a voltage detection line L5. A voltage detection line (L2 to L4) is provided between each cell C and the voltage detector 8 to detect a voltage value VB of a current path.

The secondary battery 5 and the current sensor 4 are connected to a load 11 and a charger 15 in series via a line 10. The temperature sensor 6 is arranged to be in contact with the bus bar B3B or to be separated from and adjacent to the bus bar B3B. The temperature sensor 6 outputs a detection signal according to a temperature of the bus bar B3B, and the temperature detector 7 detects a temperature T (° C.) of the bus bar B3B based on the detection signal from the temperature sensor 6 and transmits a detection result to the BM 3 via a transmission line 16.

The voltage detector 8 detects a voltage value of a current path including each cell C independently. Specifically, the voltage detector 8 detects a voltage between the voltage detection point P1 of the bus bar B1 and the voltage detection point P2 of the bus bar B2. Namely, the voltage detector 8 detects a voltage value VB1 of the current path including the cell C1, the bus bar B1A, and the bus bar B2B with using the voltage detection lines L1, L2.

The voltage detector 8 detects a voltage between the voltage detection point P2 of the bus bar B2 and the voltage detection point P3 of the bus bar B3. Namely, the voltage detector 8 detects a voltage value VB2 of the current path including the cell C2, the bus bar B2A, and the bus bar B3B with using the voltage detection lines L2, L3.

The voltage detector 8 detects a voltage between the voltage detection point P3 of the bus bar B3 and the voltage detection point P4 of the bus bar B4. Namely, the voltage detector 8 detects a voltage value VB3 of the current path including the cell C3, the bus bar B3A, and the bus bar B4B with using the voltage detection lines L3, L4.

The voltage detector 8 detects a voltage between the voltage detection point P4 of the bus bar B4 and the voltage detection point P5 of the bus bar B5. Namely, the voltage detector 8 detects a voltage value VB4 of the current path including the cell C4, the bus bar B4A, and the bus bar B5B with using the voltage detection lines L4, L5.

According to the present embodiment, the voltage detection lines L2 to L4 each of which is connected between the cells C are commonly used to detect a voltage value (a voltage value between the voltage detection points P) VB of a current path including a corresponding cell C.

The voltage detector 8 transmits the detection results that are the voltage values VB1 to VB4 between the voltage detection points P to the BM 3 via the transmission line 16.

The BM 3 includes a central processing unit (hereinafter, referred to as a CPU) 12, a memory 13, and a current detector 14. The current sensor 4 outputs a detection signal according to a current flowing through the secondary battery 5, and the current detector 14 detects a current flowing through the secondary battery 5 based on the detection signal from the current sensor 4. As illustrated in FIG. 1, the current sensor 4 detects a current flowing through the secondary battery 5 via lines connecting the secondary battery 5, the charger 15 and the load 11. A current flowing through the secondary battery 5, a current flowing through the cell C, and a current flowing through the bus bar B are same. Therefore, according to the present embodiment, the current detector 14 detects a current flowing through the bus bar B by detecting a current flowing through the secondary battery 5. The current sensor 4 may be provided adjacent to the bus bar B and directly detect a current flowing through the bus bar B.

Specifically, the current detector 14 detects a current value I (A) of a charging current flowing from the charger 15 to the secondary battery 5 or a current value I (A) of a discharging current flowing from the secondary battery 5 to the load 11. The current detector 14 detects whether the current flowing through the secondary battery 5 is a charging current or a discharging current according to a flowing direction in which the current flows through the secondary battery 5. The BM 3 is an example of a controller (a process executor).

The memory 13 stores various programs that control operations of the BM 3. The CPU 12 controls various parts according to a program read from the memory 13, and executes a monitoring process that will be described later, for example.

The memory 13 stores an initial resistance value RS of the bus bar B3B and a resistance coefficient correspondence table TB. The initial resistance value RS of the bus bar B3B is a resistance value thereof when a temperature of the bus bar B3B is 25° C., for example. The initial resistance value RS of the bus bar B3B is detected at a manufacturing step of the battery pack 1 and stored in the memory 13. A resistance coefficient is a coefficient relative to the initial resistance value RS of the bus bar B3B, and the resistance coefficient changes according to a temperature of the bus bar B3B. Namely, the resistance coefficient correspondence table TB stores temperatures of the bus bar B3B and resistance coefficients that are related to each other.

The memory 13 includes a RAM and a ROM. The above-described various programs may be stored in the RAM or a non-volatile memory such as a CD-ROM, a hard disc device, or a flash memory.

(Voltage Drop Due to Bus Bar)

As described before, the secondary battery 5 includes the thermal insulation W between the cell C2 and the cell C3. Therefore, the bus bar B3B is longest among the bus bars B. Each of the bus bars B has a same thickness. Therefore, the resistance value of the bus bar B3B is greatest and a resistance value of the bus bar B is greatest in the current path including the bus bar B2A and the bus bar B3B.

Accordingly, for example, if several hundreds amps (A) of current flows through the secondary battery 5, the voltage drop occurring in the bus bar B is greatest in the current path including the bus bar B2A and the bus bar B3B.

For example, as illustrated in FIG. 4, if a current of a current value I (for example, 200A) flows through the secondary battery 5 with the resistance value RB (for example, 100 µΩ) of the bus bar B in the current path including the bus bar B2A and the bus bar B3B, a voltage drop value VD3 in the current path including the bus bar B2A and the bus bar B3B is I×RB=20 mV.

A resistance value RA of the respective bus bars B in the current path including the bus bar B1A and the bus bar B2B, the current path including the bus bar B3A and the bus bar B4B, and the current path including the bus bar B4A and the bus bar B5B is quite small (for example 10 ®Ω) that can be negligible. Therefore, a voltage drop value VD in the current path is I×RA=2 mV. The resistance value RA is a small value that can be negligible and therefore, it is not described in FIG. 4.

The voltage detector 8 detects a voltage between the voltage detection points P. Therefore, the voltage detector 8 transmits a voltage value VB2 to the BM 3 as the voltage value of the cell C2. The voltage value VB2 is obtained by adding the voltage drop value VD3 in the current path including the bus bar B2A and the bus bar B3B to the voltage value V2 of the cell C2. In such a case, the CPU 12 determines that the voltage value VB2 that is received as the voltage value of the cell C2 is greater than a reference voltage value, and may erroneously determine that the cell C2 is in an overcharge state. According to the erroneous determination of the CPU 12, the CPU 12 may discharge the cell C2 that is actually not in the overcharge state via a discharge circuit that is not illustrated.

On the other hand, a voltage drop value VD in the current path including the bus bar B1A and the bus bar B2B, the current path including the bus bar B3A and the bus bar B4B, and the current path including the bus bar B4A and the bus bar B5B is a quite small value that is negligible compared to the voltage values V1, V3, V4 of the cells C1, C3, C4. Therefore, the CPU 12 does not determine that the received voltage value VB is greater than the reference voltage value, and the CPU 12 is less likely to erroneously determine that the cell C1, the cell C3, and the cell C4 are in the overcharge state.

To obviate the erroneous determination of the CPU 12 that the cell C that is actually not in an abnormal state such as the overcharge state is in the abnormal state, the CPU 12 calculates the voltage drop value in the current path including the bus bar B having a great resistance value and adds or subtracts the calculated voltage drop value to or from the voltage value VB between the voltage detection points P. Accordingly, the voltage between the terminals of the cell C is effectively and precisely calculated. Therefore, the CPU 12 performs a monitoring process descried below.

(Monitoring Process)

Figure 5:
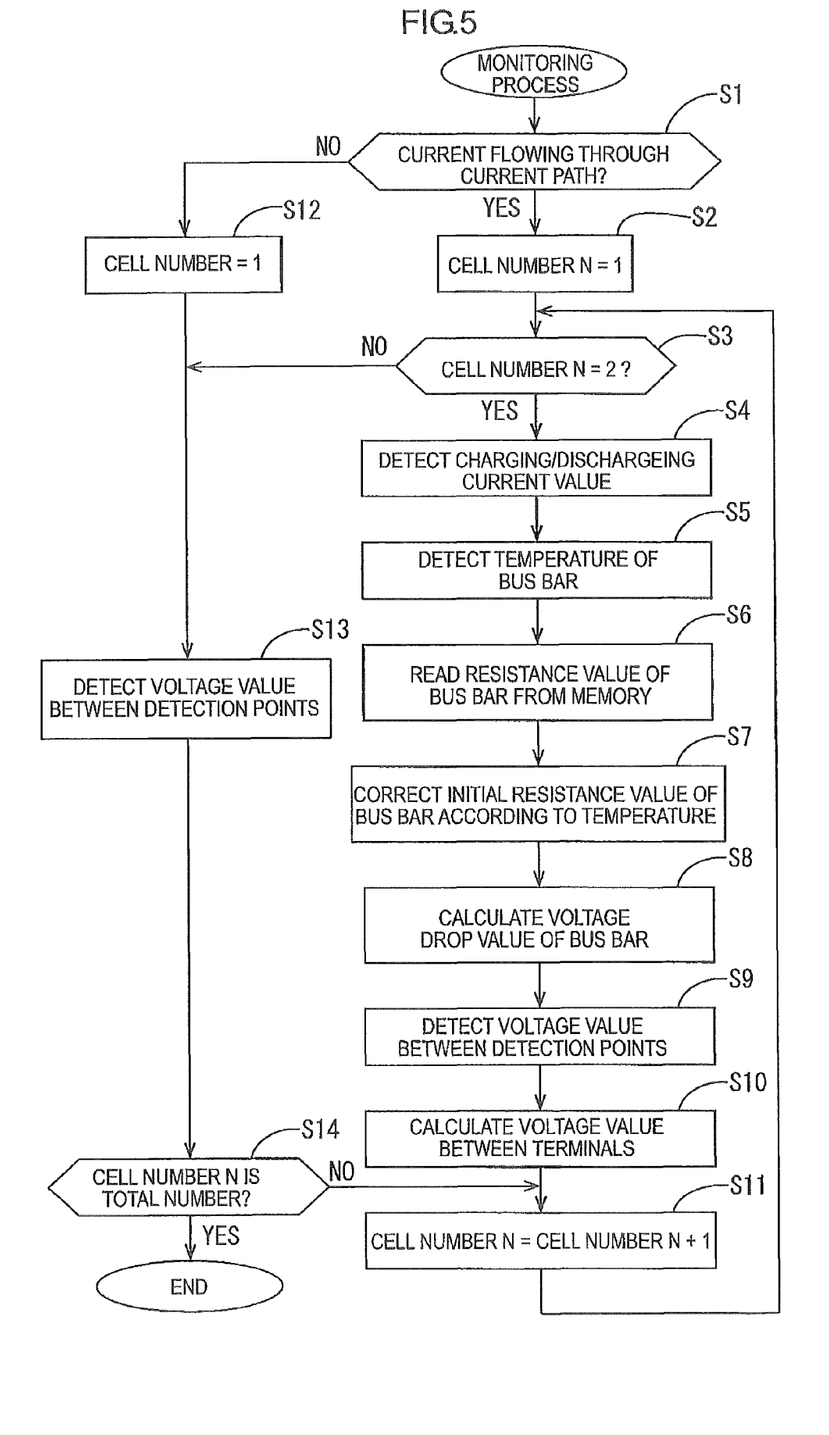
FIG. 5 is a flowchart illustrating a monitoring process.

If execution conditions are satisfied, the BM 3 performs a monitoring process illustrated in FIG. 5. Examples of the execution conditions include power-on of a vehicle caused by an operation of an ignition key by a user or elapse of reference time from the previous execution of the monitoring process.

The CPU 12 determines whether a current flows through the secondary battery 5 or whether a current flows through the bus bar B (S1). Specifically, the CPU 12 determines whether a current value of current flowing through the secondary battery 5 is equal to or greater than a certain value based on a detection result from the current detector 14. If determining that the current value is equal to or greater than the certain value, the CPU 12 determines that the current flows through the secondary battery 5. For example, the certain value is greater than a value of a dark current of the secondary battery 5 and smaller than a value of a charging/discharging current. The process of S1 is an example of a determination process.

If determining that the current flows through the secondary battery 5 or the current flows through the bus bar B (S1: YES), the CPU 12 initializes a cell number N to be 1 (S2). Next, the CPU 12 determines whether the cell number N is 2 (S3). If determining that the cell number N is 2 (S3: YES), the CPU 12 perform s processes from S4. This determination is made so that the following is less likely to occur. The CPU 12 determines that the voltage value VB2 received as the voltage value of the cell C2 is greater than the reference voltage value and erroneously determines that the cell C2 is in the overcharge state.

Specifically, the CPU 12 first detects a current value ID of a charging/discharging current flowing through the secondary battery 5 or a current value ID of a current flowing through the bus bar B via the current detector 14 (S4).

Next, the CPU 12 detects a temperature T of the bus bar B3B via the temperature detector 7 (S5). The CPU 12 reads the initial resistance value RS of the bus bar B3B that is previously stored in the memory 13 (S6). Then, the CPU 12 corrects the initial resistance value RS of the bus bar B3B according to the temperature T of the bus bar B3B that is detected in the process of S5 and the resistance coefficient correspondence table TB (S7).

Specifically, the CPU 12 determines a resistance coefficient according to the temperature T of the bus bar B3B that is detected in the process of S5 and the resistance coefficient correspondence table TB, and multiples the determined resistance coefficient by the initial resistance value RS of the bus bar B to correct the initial resistance value RS of the bus bar B. The process of S7 is an example of the resistance correction process.

The CPU 12 calculates a voltage drop value VD2 (=ID× RH) of the bus bar B3B based on the current value ID of the charging/discharging current of the cell C2 that is detected in the process of S4 or the current value ID of the current flowing through the bus bar B3B and the resistance value RH of the bus bar B3B that is corrected according to the temperature of the bus bar B3B and obtained in the process of S7 (S8). The process of S8 is an example of the voltage drop determination process.

The CPU 12 detects a voltage value VB2 between the voltage detection point P2 and the voltage detection point P3 via the voltage detector 8 (S9).

Then, the CPU 12 calculates a voltage value between terminals VR2 of the cell C2 based on the voltage drop value VD2 of the bus bar B3B that is calculated in the process of S8, and the voltage value VB2 between the voltage detection point P2 and the voltage detection point P3 that is detected in the process of S9 (S10). The process of S10 is an example of the voltage between terminals determination process.

For example, if the CPU 12 determines that a current flowing through the cell C2 is a charging current according to the detection result from the current detector 14, the CPU 12 calculates the voltage value VR2 between terminals of the cell C2 by subtracting the voltage drop value VD2 from the voltage value VB2 (VR2=VB2−VD2). This is because the voltage value VB2 between the voltage detection point P2 and the voltage detection point P3 is higher than the voltage value VR2 between terminals of the cell C2 by the voltage drop value VD2. The voltage drop value VD2 is obtained based on the current flowing into the cell C2 and the resistance value RH of the bus bar B3B that is corrected according to the temperature.

If the CPU 12 determines that the current flowing through the cell C2 is a discharging current according to the detection result from the current detector 14, the CPU 12 calculates the voltage value VR2 between terminals of the cell C2 by adding the voltage drop value VD2 to the voltage value VB2 (VR2=VB2+VD2). This is because the voltage value VB2 between the voltage detection point P2 and the voltage detection point P3 is lower than the voltage value VR2 between terminals of the cell C2 by the voltage drop value VD2. The voltage drop value VD2 is obtained based on the current flowing out of the cell C2 and the resistance value RH of the bus bar B3B that is corrected according to the temperature.

Then, the CPU 12 increments the cell number N by one (S11) and returns to the process of S3.

If determining that no current flows through the secondary battery 5 (S1: NO), the CPU 12 obtains a voltage value VR between terminals of a cell C without performing the processes of S2 to S11. Specifically, the CPU 12 initializes the cell number N (S12) and detects a voltage value VB between the voltage detection points P via the voltage detector 8 (S13).

When no current flows through the secondary battery 5, voltage drop does not occur in the bus bar B and therefore, the CPU 12 can obtain the voltage value VR between terminals of a cell C only by performing the process of S13. Therefore, the CPU 12 can obtain the voltage value VR between terminals of a cell C without performing the processes of S2 to S11.

When no current flows through the secondary battery 5, it does not necessarily mean that the secondary battery 5 completely stops charging or discharging. For example, when a standby current flows through the load 11 that is connected to the secondary battery 5 (for example, less than several mA) or when a dark current flows through the BM 3 (for example, several hundreds μA or less, it is meant that no current flows through the secondary battery 5.

After performing the process of S13, the CPU 12 determines whether the cell number N reaches a total number of the cells (S14). If determining that the cell number N does not reach the total number of the cells (S14: NO), the CPU 12 increments the cell number N by one (S11) and returns to the process of S3. If determining that the cell number N reaches the total number of the cells (S14: YES), the CPU 12 terminates the monitoring process.

If determining that the cell number N is not 2 (S3: NO), the CPU 12 does not perform the process of S4 and the subsequent processes and obtains the voltage value VR between terminals of a cell C. Specifically, the CPU 12 performs the process of S13 and the subsequent processes.

As described above, the voltage drop value VD in the current path including the bus bar B1A and the bus bar B2B, in the current path including the bus bar B3A and the bus bar B4B, and in the current path including the bus bar B4A and the bus bar B5B is a quite small value that is negligible compared to the voltage values V1, V3, V4 of the respective cells C1, C3, C4. Therefore, the voltage values VR1, VR3, VR4 between terminals of the respective cells C1, C3, C4 is substantially equal to the respective voltage values V1, V3, V4 of the cells C1, C3, C4.

Namely, only the initial resistance value RS of the bus bar B3B having the large resistance value is stored in the memory 13, and the BM 3 calculates only the voltage drop value VD2 in the bus bar B3B and precisely determines the voltage value VR2 between terminals of the cell C2. The BM 3 does not calculate the voltage drop value VD in the bus bar having a small resistance value, and this enhances efficiency of the monitoring process.

Advantageous Effects of the Present Embodiment

According to the present embodiment, the CPU 12 calculates the voltage value VR between terminals of the cell C according to the voltage drop value VD of the bus bar B and the voltage value VB between the voltage detection points P provided on the bus bar B. Accordingly, even if different lengths of the bus bars B makes the resistance values of the bus bars B to be varied and the voltage drop value VD of the bus bar B is varied between the voltage detection points P, the CPU 12 precisely calculates the voltage value VR between terminals of the cell C with having less influence of the voltage drop value VD of the bus bar B.

One of the voltage detection lines (L2 to L4) that are provided between a point between the cells C and the voltage detector 8 is commonly used to detect a voltage value (a voltage value between the voltage detection points P) VB of the current path. This reduces the number of the voltage detection lines L. To commonly use the voltage detection lines (L2 to L4), the voltage detection point P of the current path cannot be located near each of the cells C. However, a voltage between terminals of an electric storage device such as a battery can be determined with having less influence of the location of the voltage detection point P.

Second Embodiment

Next, an electric storage system 100 according to a second embodiment will be described with reference to FIGS. 6 to 8. In the following, components different from those in the first embodiment will be described. Components that are same as those in the first embodiment are represented by the same numbers and will not be explained.

Figure 6:
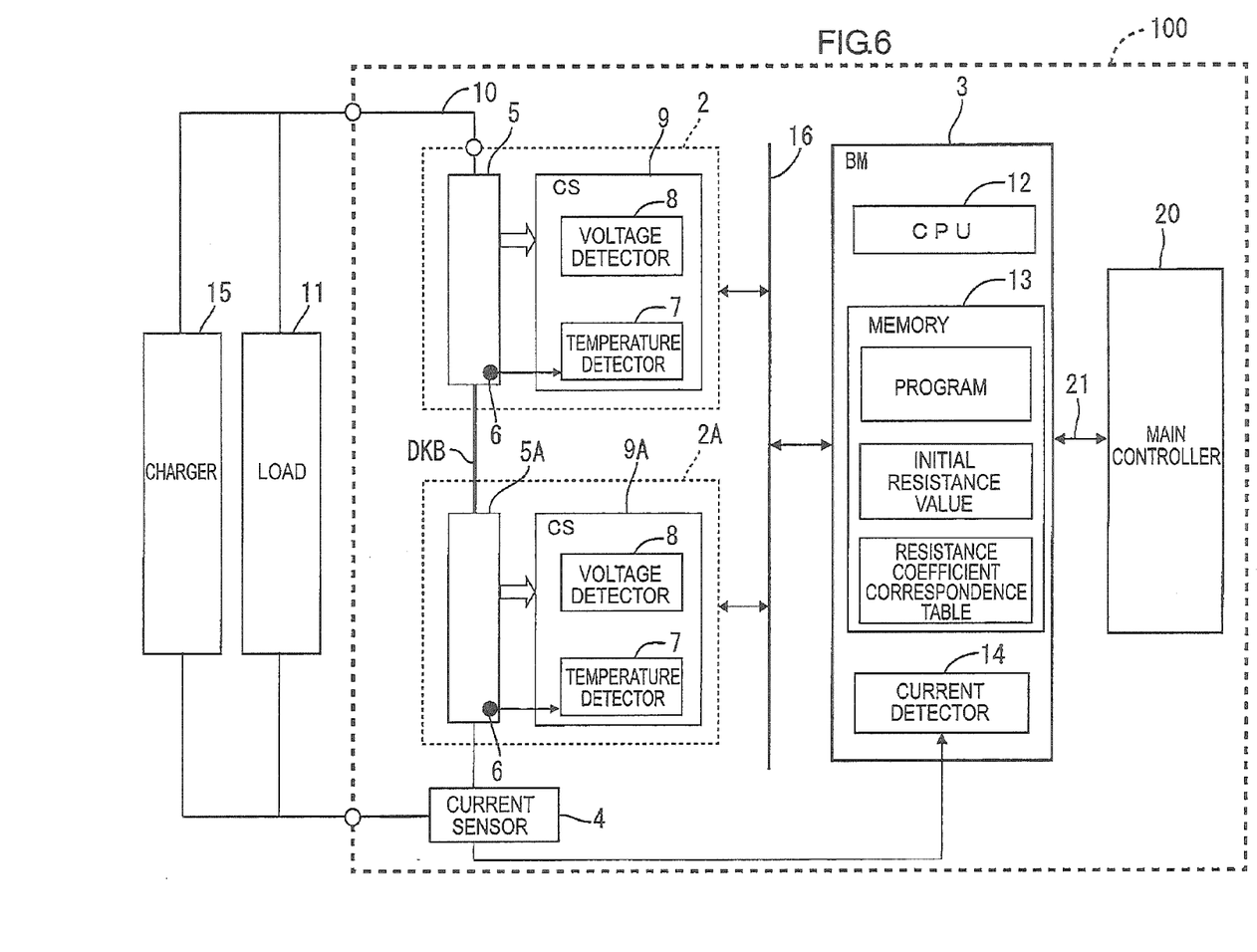
FIG. 6 is a general block diagram of an electric storage system according to a second embodiment.

As illustrated in FIG. 6, the electric storage system 100 includes two battery modules 2, 2A, the current sensor 4, the BM 3, a main controller 20, communication lines 21 and a bus bar between batteries (an example of a conductive member between device groups) DKB.

The secondary battery 5 of the battery module 2 and a secondary battery 5A of the battery module 2A are connected in series by the bus bar between batteries DKB.

The main controller 20 is connected to the BM 3 via the communication line 21. The main controller 20 transmits and receives various data to and from the BM 3 via the communication line 21 to manage the BM 3. The main controller 20 manages the electric storage system 100 as a whole. For example, the main controller 20 controls a charging/discharging current flowing through the secondary batteries 5, 5A.

The current value ID of the charging/discharging current flowing through the secondary batteries 5, 5A is detected by the current detector 14 via the current sensor 4 and transmitted to the CPU 12. The current value ID is used to calculate a voltage value between terminals VR of each cell C, as described before.

The CPU 12 performs the voltage drop determination process relating to the bus bar between the batteries DKB similarly to the voltage drop determination process relating to the bus bar B3B. After the voltage drop determination process relating to the bus bar between batteries DKB, the CPU 12 performs the voltage between terminals determination process.

Figure 7:
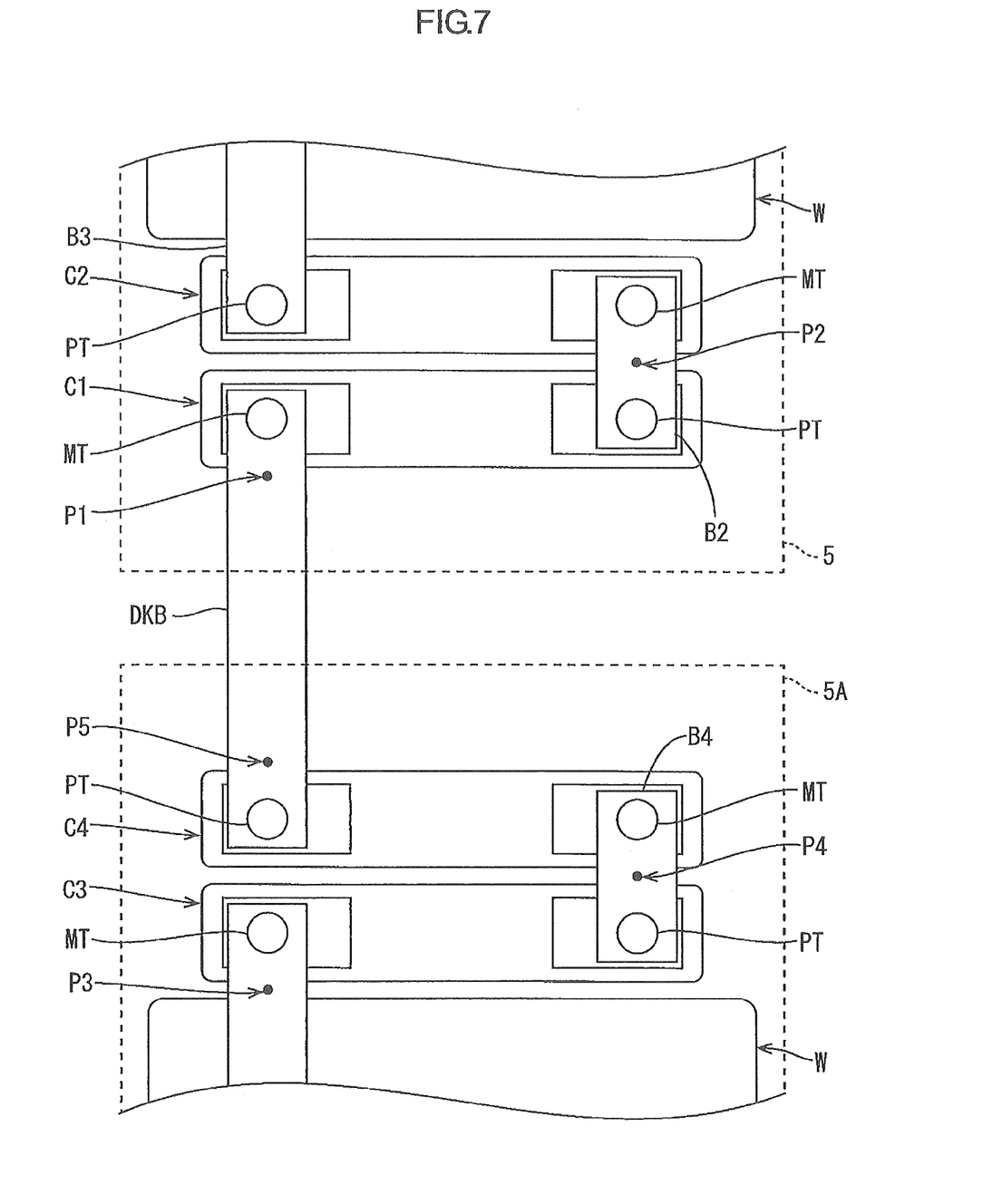
FIG. 7 is an upper view illustrating a part of the electric storage system where secondary batteries are connected.

Specifically, if the CPU 12 determines that a current flowing through the cell C4 included in the secondary battery 5A illustrated in FIG. 7 is a charging current according to a detection result from the current detector 14, the voltage value VR4 between terminals of the cell C4 is calculated by subtracting the voltage drop value VDP from the voltage value VB4 (VR4=VB4−VDP). This is because the voltage value VB4 between the voltage detection point P1 and the voltage detection point P4 is higher than the voltage value VR4 between terminals of the cell C4 by the voltage drop value VDP. The voltage drop value VDP is obtained based on the current flowing into the cell C4 and the resistance value of the bus bar between batteries DKB that is corrected according to the temperature.

The voltage value VB4 is a potential difference between a voltage detection point P1 of the secondary battery 5 and a voltage detection point P4 of the secondary battery 5A illustrated in FIG. 7. The CPU 12 detects a voltage at the voltage detection point P1 of the secondary battery 5 by the voltage detector 8 of the battery module 2, and detects a voltage at the voltage detection point P4 of the secondary battery 5A by the voltage detector 8 of the battery module 2A. The CPU 12 calculates the voltage value VB4 with using the detection results.

According to the second embodiment, when the voltage value VR2 between terminals of the cell C2 included in each of the secondary batteries 5, 5A is calculated, the voltage drop value VD2 of the bus bar B3B is taken into consideration, and when the voltage value VR4 between terminals of the cell C4 included in the secondary battery 5A is calculated, voltage dropping in the bus bar between batteries DKB is taken into consideration. A potential difference between the voltage detection point P2 of the secondary battery 5 and the voltage detection point P5 of the secondary battery 5A illustrated in FIG. 7 may be obtained. When the voltage value VR1 between terminals of the C1 included in the secondary battery 5 is calculated, the voltage dropping in the bus bar between the batteries DKB may be taken into consideration.

In the electric storage system 100 including a plurality of secondary batteries 5 (electric storage device group), a distance between the secondary batteries 5, 5A is likely to be great. This increases a voltage dropping degree in the bus bar between batteries DKB that connects the secondary batteries 5, 5A. Therefore, in the electric storage system 100 according to the second embodiment, a voltage between terminals of a cell C is more effectively determined with having less influence of the voltage dropping in the bus bar between batteries DKB.

The configuration of the electric storage system 100 where the two secondary batteries 5 are connected by the bus bar between batteries DKB is not necessarily limited to that illustrated in FIG. 6. For example, an electric storage system 100A illustrated in FIG. 8 may include two secondary batteries 5, 5A that are connected to a common CS 9. In such a configuration, a voltage between terminals of each cell C of the secondary battery 5, 5A is detected by the single voltage detector 8. The CS 9 and the BM 3 are arranged on a single circuit board 30.

Figure 8:
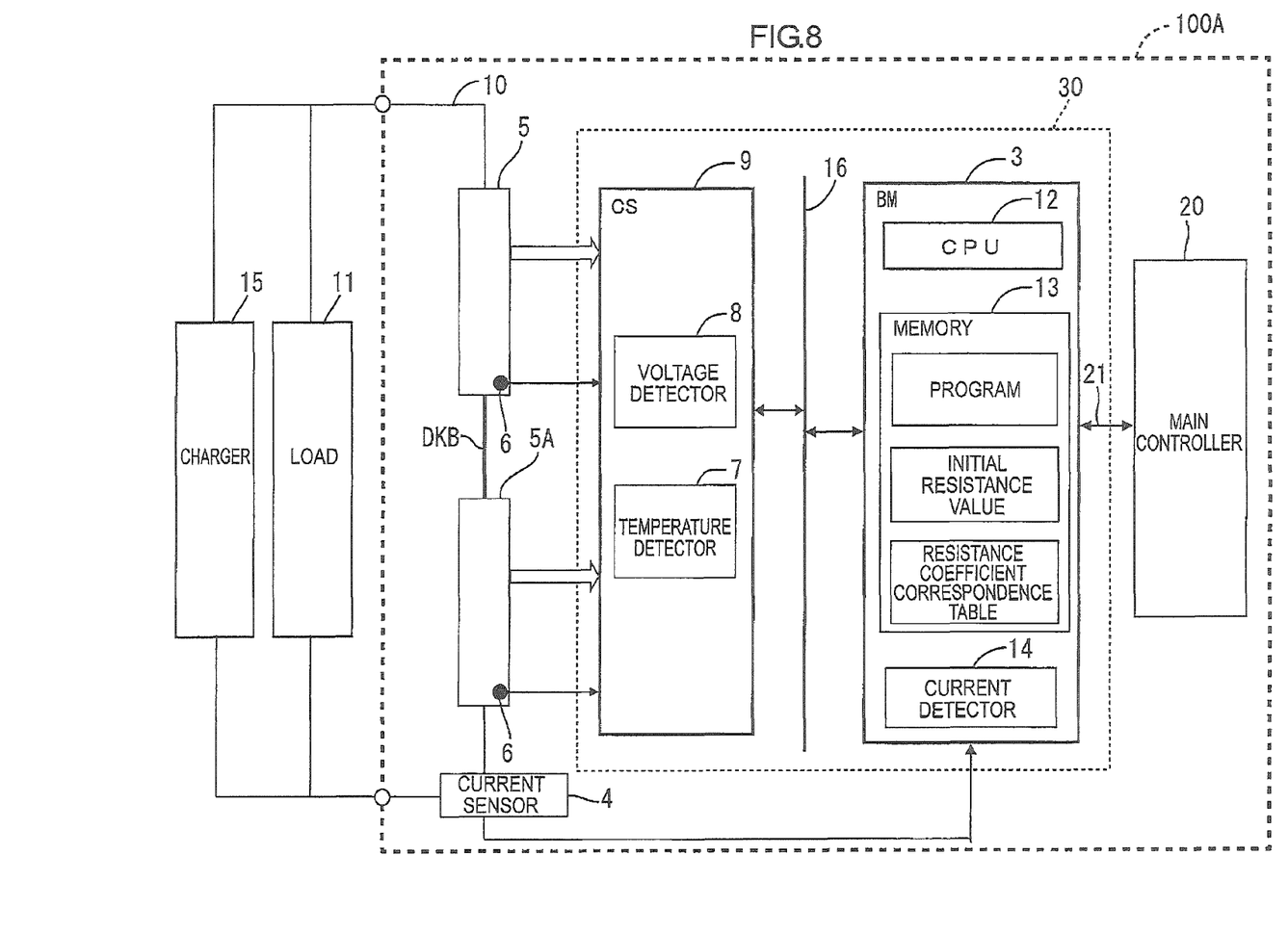
FIG. 8 is a general block diagram of another electric storage system according to the second embodiment.

In the electric storage systems 100, 100A illustrated in FIGS. 6 and 8, the two secondary batteries 5, 5A are connected in series by the single bus bar between batteries DKB. It is not limited thereto. For example, each of the electric storage systems 100, 100A may include three secondary batteries 5 that are connected in series by two bus bars Between batteries DKB or may include four secondary batteries 5 that are connected in series by three bus bars between batteries DKB.

In FIGS. 6 and 8, the main controller 20 and the communication line 21 may not be included and the configuration including the secondary batteries 5 and the bus bar between batteries DKB may be constituted as a battery pack or an electric storage apparatus.

Other Embodiments

The technology described in this specification is not limited to the embodiments described above and illustrated in the drawings. The following various embodiments are also included in the technical scope of the present technology.

In the above embodiments, the battery pack 1 (the electric storage apparatus) may be a vehicular storage apparatus that is mounted to a vehicle, and the BM 3 (the controller) may be configured to perform the voltage between terminals determination process in at least one of starting of a vehicular engine and a regenerating operation.

Generally, when an internal combustion engine of the vehicle starts, a great current flows from an electric storage device such as a battery to a starter motor that starts the internal combustion engine of the vehicle and this increases a voltage drop value in a conductive member. The voltage dropping may greatly influence determination of a voltage between terminals of the electric storage device. In charging the battery during the vehicle's regenerating operation such as regenerative brake, a great current flows and this increases a voltage drop value of the conductive member. However, according to the electric storage apparatus, at the starting of the vehicular engine or in the regenerating operation, a voltage between terminals of the electric storage device such as a battery is more effectively determined with having less influence of the voltage dropping in the conductive member.

In the above embodiments, the secondary battery 5 may be a battery for starting a vehicle. The electric storage apparatus (the battery pack 1) may include an electric storage device group (the secondary battery 5) including electric storage devices (cells C) that are connected in series, and the electric storage device group may be a battery for a starter motor of a vehicle.

With such an electric storage apparatus, a voltage between terminals of an electric storage device such as a battery is more effectively determined with having less influence in the starting of the vehicular engine with such a battery for a starter motor of a vehicle.

In the above embodiments, the BM 3 includes one CPU and one memory. However, the BM 3 may include a plurality of CPUs or include a hard circuit such as an Application Specific Integrated Circuit (ASIC), or include both of the hardware circuit and the CPU. For example, a part of or each of the steps included in the voltage between terminals detection process may be performed by an independent CPU or an independent hardware circuit.

In the above embodiments, the secondary battery 5 including a plurality of cells that are connected in series is used as the electric storage device. However, it is not limited thereto and the electric storage device may include a single cell or may include a plurality of cells that are connected in parallel. The number of cells may be two, three, five or more and may be altered if necessary. The electric storage device may not be necessarily a lithium ion battery but may be other secondary battery such as a lead battery and a nickel hydride battery. Further, the electric storage device may not be necessarily a secondary battery but may be a capacitor or an electric double layer capacitor.

In the above embodiments, the CPU 12 is configured to perform calculation according to the temperature T of the bus bar B3B and the resistance coefficient correspondence table TB and corrects the initial resistance value RS of the bus bar B3B. However, the CPU 12 may be configured to store map data of resistance values of the bus bar B3B corresponding to temperatures T of the bus bar B3B in the memory 13, and correct the initial resistance value RS of the bus bar B3B according to the temperature T of the bus bar B3B and the map data.

In the above embodiments, the temperature sensor 6 is arranged to be in contact with the bus bar B3B or to be separated from and adjacent to the bus bar B3B. However, the temperature sensor 6 may be arranged to be in contact with the secondary battery 5 or to be separated from and adjacent to the secondary battery 5. In such a configuration, the temperature sensor 6 may outputs a detection signal according to a temperature of the secondary battery 5. The temperature detector 7 may detects a temperature of the secondary battery 5 based on the detection signal from the temperature sensor 6 and transmit the detection result to the BM 3 via the communication line 16. The CPU 12 may perform a resistance correction process to correct a resistance value of the bus bar B3B according to a temperature of the secondary battery 5. In such a case, for example, a map representing correspondence between temperatures of the bus bar B3B and temperatures T of the secondary battery 5 may be obtained by previously performed experiments. The temperature of the secondary battery 5 may be corrected based on the map and used as the temperature of the bus bar B3B. In such a case, the temperature sensor 6 that detects a temperature of the secondary battery 5 may be commonly used as the temperature sensor that detects a temperature of the bus bar B3B.

Further, the temperature sensor 6 may be a temperature sensor that measures an environmental temperature. In such a case, for example, a map representing correspondence between temperatures of the bus bar B3B and environmental temperatures may be previously obtained by previously performed experiments. The environmental temperature may be corrected based on the map and used as the temperature of the bus bar B3B.

In the above embodiments, the bus bar B is used as an example of the conductive member. However, it is not limited thereto and the conductive member may be a lead wire or a conductive resin. The conductive member may be any material through which a current easily flows.

In the above embodiments, a positive terminal PT of one of adjacent cells C and a negative terminal MT of another one of the adjacent cells C are connected to each other via the bus bar B that is conductive plate member. However, it is not limited thereto and the bus bar B may be configured to connect a plurality of secondary batteries 5.

In the above embodiments, the CPU 12 is configured to determine whether a current flows through the secondary battery 5 based on the detection signal from the current sensor 4. However, an upper ECU may detect a current flowing through the secondary battery 5 and the CPU 12 may be configured to determine that a current flows through the secondary battery 5 when receiving a signal from the ECU.

In the above embodiments, the voltage detector 8 is configured to transmit the detection results of the voltage values VB 1 to VB4 between the voltage detection points P to the BM 3 via the transmission line 16. However, it is not limited thereto and an upper ECU may detect the voltage values VB1 to VB4 between the voltage detection points P and the BM 3 may be configured to obtain the voltage values VB1 to VB4 between the voltage detection points P by receiving a signal from the ECU. The upper ECU may calculate a voltage value VR between terminals of each cell C based on a voltage value VB between the voltage detection points P and a voltage drop value VD of a bus bar B and transmit the calculation result to the BM 3.

In the above embodiments, the battery pack 1 is mounted to an automobile. However, it is not limited thereto and the battery pack 1 may be used for other devices such as an electric storage system in a power plant.

In the above embodiments, among the current paths each including a bus bar B, only the initial resistance value RS of the bus bar B3B having a large resistance value is stored in the memory 13. The BM 3 calculates only the voltage drop value VD of the bus bar B3B and precisely determines the voltage value VR2 between terminals of the cell C2. However, it is not limited thereto and among the current paths each including a corresponding bus bar B, resistance values of the bus bars B having small resistance values may be also stored in the memory 13. The BM 3 may calculate voltage drop values VD of all of the bus bars B and determine a voltage value VR between terminals of each cell C.

In the above embodiments, all of the bus bars B1 to B5 have a same thickness. However, it is not limited thereto and each of the bus bars B1 to B5 may have a different thickness or may have a different length, or some of the bus bars B1 to B5 may have a same length. The number of the bus bars B may be altered according to the number of cells.

In the above embodiments, the voltage detector 8 is configured to independently detect a voltage value of each current path including each one of the cells C. However, it is not limited thereto and the voltage detector 8 may be configured to detect a voltage value between the voltage detection point P1 and the voltage detection point P5 and detect a total voltage (module voltage) corresponding to the four cells C.

In the above embodiments, the initial resistance value RS of the bus bar B3B is detected at a manufacturing step of the battery pack 1 and stored in the memory 13. However, it is not limited thereto and the initial resistance value RS of the bus bar B3B may be detected by the BM 3 when the battery pack 1 is used. Further, the initial resistance value RS of the bus bar B3B may be detected by the BM 3 and stored in the memory 13 when the battery pack 1 is used. The initial resistance value RS of the bus bar B3B may not be necessarily a resistance value at the time that the temperature of the bus bar B3B is 25° C. but may be a resistance value at the time that the bus bar B3B is at a different temperature.

In the above embodiments, the secondary battery 5 includes the thermal insulation W between the cell C2 and the cell C3. However, the secondary battery 5 does not necessarily include the thermal insulation but may include a division plate or an obstacle. Namely, something that causes a length of a bus bar to be different from other bus bars may be provided between the cells. The thermal insulation W may not be necessarily provided between the cell C2 and the cell C3 but may be provided between any adjacent cells C.

The invention claimed is:

1. An electric storage device management apparatus, comprising:
a controller configured to:
perform a voltage drop determination to determine a voltage drop value of a conductive member that connects electric storage devices; and
determine a voltage between terminals of one of the electric storage devices to determine a voltage value between the terminals of the one of the electric storage devices after the voltage drop determination;
a voltage detector connected to the electric storage devices via the conductive member and configured to detect a voltage value of a current path including the one of the electric storage devices and the conductive member;
a memory storing a resistance value of the conductive member; and
a current detector configured to detect a current value of a current flowing through the conductive member,
wherein the controller is further configured to:
determine the voltage drop value of the conductive member based on the resistance value of the conductive member and the current value of the current flowing though the conductive member in the voltage drop determination; and
determine the voltage value between the terminals of the one of the electric storage devices based on the voltage value of the current path and the voltage drop value of the conductive member in the determining the voltage between the terminals, and
wherein the controller manages the electric storage devices by using the determined voltage value to control charging and discharging of the electric storage devices.

2. The electric storage device management apparatus according to claim 1, further comprising:
a temperature detector configured to detect temperature of the conductive member,
wherein the controller is further configured to:
perform a resistance correction to correct the resistance value of the conductive member according to the temperature of the conductive member; and
determine the voltage drop value of the conductive member based on the resistance value corrected in the resistance correction and the current value in the voltage drop determination.

3. The electric storage device management apparatus according to claim 1, wherein the controller is further configured to:
determine whether a current flows through the conductive member; and
perform the voltage drop determination and the determining the voltage between the terminals according to the determination that the current flows through the conductive member in the voltage drop determination.

4. An electric storage apparatus, comprising:
electric storage devices connected in series;
a conductive member configured to connect the electric storage devices; and
the electric storage device management apparatus according to claim 1.

5. The electric storage apparatus according to claim 4, wherein the electric storage management apparatus further includes:
a voltage detector connected to the electric storage devices via the conductive member and configured to detect a voltage value of a current path including one of the electric storage devices and the conductive member, and wherein a voltage detection line is arranged between the voltage detector and a portion of the conductive member between the electric storage devices to connect the voltage detector and the portion of the conductive member between the electric storage devices and detect the voltage value of the current path.

6. The electric storage apparatus according to claim 4, wherein the electric storage apparatus includes a vehicular electric storage apparatus that is to be mounted on a vehicle, and wherein the controller is further configured to perform the determining the voltage between the terminals in at least one of starting of an engine of the vehicle and a regenerating operation of the vehicle.

7. The electric storage apparatus according to claim 6, further comprising:

an electric storage device group including the electric storage devices that are connected in series, wherein the electric storage device includes a battery for a starter motor of a vehicle.

8. An electric storage system, comprising:

the electric storage apparatus according to claim 4;

a plurality of electric storage device groups that are connected in series and each of which including the electric storage devices that are connected in series; and a conductive member between device groups configured to connect the electric storage device groups as the conductive member, wherein the controller is further configured to:

perform the voltage drop determination for the conductive member between electric storage device groups; and perform the determining the voltage between the terminals after the voltage drop determination for the conductive member between electric storage device groups.

9. The electric storage device management apparatus according to claim 1, further comprising:

a load connected in series to the electric storage devices, an electric power being supplied from the electric storage devices to the load.

10. The electric storage device management apparatus according to claim 9, further comprising:

a charger generating an electric power to charge a battery pack that includes the electric storage devices.

11. The electric storage device management apparatus according to claim 10, further comprising:

a current sensor detecting, in lines connecting the electric storage devices in series with the charger and the load, a current flowing through the electric storage devices.

12. A method of managing an electric storage device, the method comprising:

a voltage drop determination process to determine a voltage drop value of a conductive member connecting electric storage devices; and determining a voltage between terminals of one of the electric storage devices to determine a voltage value between the terminals of the one of the electric storage devices after the voltage drop determination;

detecting a voltage value of a current path including the one of the electric storage devices and the conductive member;

storing, in a memory, a resistance value of the conductive member;

detecting a current value of a current flowing through the conductive member;

determining the voltage drop value of the conductive member based on the resistance value of the conductive member and the current value of the current flowing though the conductive member in the voltage drop determination; and determining, by a controller, the voltage value between the terminals of the one of the electric storage devices based on the voltage value of the current path and the voltage drop value of the conductive member in the determining the voltage between the terminals, and wherein the controller manages the electric storage devices by using the determined voltage value to control charging and discharging of the electric storage devices.

13. The method according to claim 12, further comprising:

detecting a temperature of the conductive member; and correcting the resistance value of the conductive member according to the temperature of the conductive member.

14. The method according to claim 13, further comprising:

determining the voltage drop value of the conductive member based on a corrected resistance value in the resistance correction and the current value in the voltage drop determination.

15. The method according to claim 12, further comprising:

determining whether a current flows through the conductive member.

16. The method according to claim 15, further comprising:

performing the voltage drop determination and the determining the voltage between the terminals according to the determination that the current flows through the conductive member in the voltage drop determination.

17. The method according to claim 12, further comprising:

controlling supplying an electric power from the electric storage devices to a load connected in series to the electric storage devices.

18. The method according to claim 17, further comprising:

charging a battery pack that includes the electric storage devices with a generated electric power by a charger.

19. The method according to claim 18, further comprising:

detecting, by a current sensor, in lines connecting the electric storage devices in series with the charger and the load, a current flowing through the electric storage devices.

* * * * *